US006996799B1

(12) United States Patent
Cismas et al.

(10) Patent No.: US 6,996,799 B1
(45) Date of Patent: Feb. 7, 2006

(54) AUTOMATIC CODE GENERATION FOR INTEGRATED CIRCUIT DESIGN

(75) Inventors: Sorin C. Cismas, Saratoga, CA (US); Kristan J. Monsen, Los Altos, CA (US); Henry K. So, Campbell, CA (US)

(73) Assignee: Mobilygen Corporation, Santa Clara, CA (US)

(*) Notice: Subject to any disclaimer, the term of this patent is extended or adjusted under 35 U.S.C. 154(b) by 569 days.

(21) Appl. No.: 09/634,131

(22) Filed: Aug. 8, 2000

(51) Int. Cl.
*G06F 9/44* (2006.01)

(52) U.S. Cl. .................. 717/106; 717/104; 717/120; 703/14; 716/18

(58) Field of Classification Search ........ 717/104–109, 717/121, 124–135, 120, 136; 716/2–4, 1, 716/18, 5, 7, 12, 13; 703/13–14, 22
See application file for complete search history.

(56) References Cited

U.S. PATENT DOCUMENTS

| | | | | |
|---|---|---|---|---|
| 5,377,122 A | * | 12/1994 | Werner et al. ................ | 716/18 |
| 5,408,667 A | | 4/1995 | Brodie et al. | |
| 5,493,508 A | * | 2/1996 | Dangelo et al. ............... | 716/5 |
| 5,678,052 A | | 10/1997 | Brisson | |
| 5,734,572 A | | 3/1998 | Guignet | |
| 5,870,588 A | * | 2/1999 | Rompaey et al. ............. | 703/13 |
| 5,892,682 A | * | 4/1999 | Hasley et al. ................ | 716/12 |
| 5,910,897 A | | 6/1999 | Dangelo et al. | |
| 5,995,736 A | | 11/1999 | Aleksic et al. | |
| 6,006,028 A | | 12/1999 | Aharon et al. | |
| 6,145,073 A | | 11/2000 | Cismas | |
| 6,151,568 A | * | 11/2000 | Allen et al. ................... | 716/18 |
| 6,199,031 B1 | | 3/2001 | Challier et al. | |
| 6,205,407 B1 | | 3/2001 | Testa et al. | |
| 6,212,566 B1 | | 4/2001 | Vanhoof et al. | |
| 6,226,780 B1 | * | 5/2001 | Bahra et al. ................... | 716/18 |
| 6,233,540 B1 | | 5/2001 | Schaumont et al. | |
| 6,324,678 B1 | | 11/2001 | Dangelo et al. | |
| 6,347,388 B1 | | 2/2002 | Hollander | |
| 6,421,808 B1 | | 7/2002 | McGeer et al. ................ | 716/1 |
| 6,446,243 B1 | * | 9/2002 | Huang et al. .................. | 716/7 |
| 2003/0018738 A1 | * | 1/2003 | Boylan et al. ................. | 716/2 |

OTHER PUBLICATIONS

Zainalabedin Navabi; "VHDL: Analysis and Modeling of Digital Systems"; McGraw-Hill, 2nd Edition; 1998.*
Madisetti et al.; "Interface Design for Core-Based Systems"; IEEE Design and Test of Computers; 1997; pp. 42-51.*
Rincon et al.; "Core Design and System-on-a-Chip Integration"; IEEE Design and Test of Computers; 1997; pp. 26-35.*
Gupta et al.; "Introducing Core-Based System Design"; IEEE Design and T st of Computers; 1997; pp. 15-25.*
Hutchins et al, "Automating IP Core Design, Configuration, and Verification," Gigapixel Corp. paper; paper footer contains marking "SNUG '99."

* cited by examiner

Primary Examiner—Kakali Chaki
Assistant Examiner—William H. Wood
(74) Attorney, Agent, or Firm—Andrei D. Popovici

(57) ABSTRACT

An integrated circuit is designed by interconnecting pre-designed data-driven cores (intellectual property, functional blocks). Hardware description language (e.g. Verilog or VHDL) and software language (e.g. C or C++) code for interconnecting the cores is automatically generated by software tools from a central circuit specification. The central specification recites pre-designed hardware cores (intellectual property) and the interconnections between the cores. HDL and software language test benches, and timing constraints are also automatically generated from the central specification. The automatic generation of code simplifies the interconnection of pre-existing cores for the design of complex integrated circuits.

48 Claims, 15 Drawing Sheets

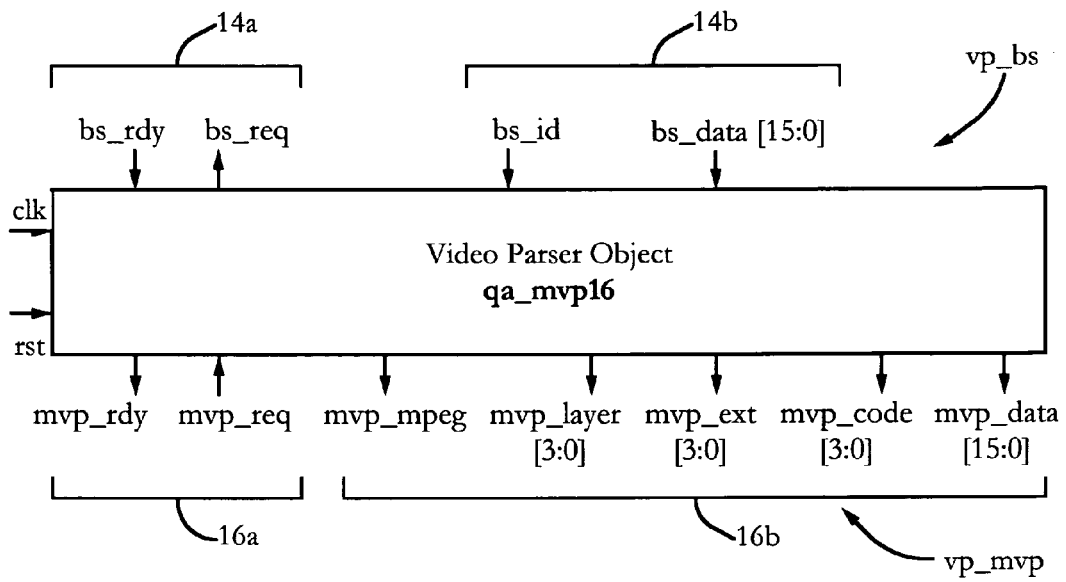
FIG. 2
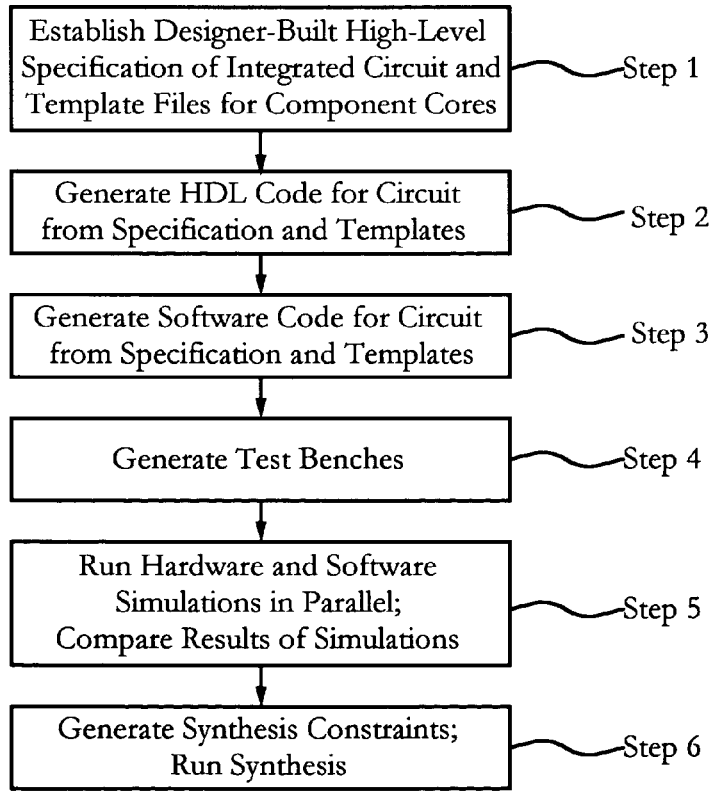
FIG. 3-B

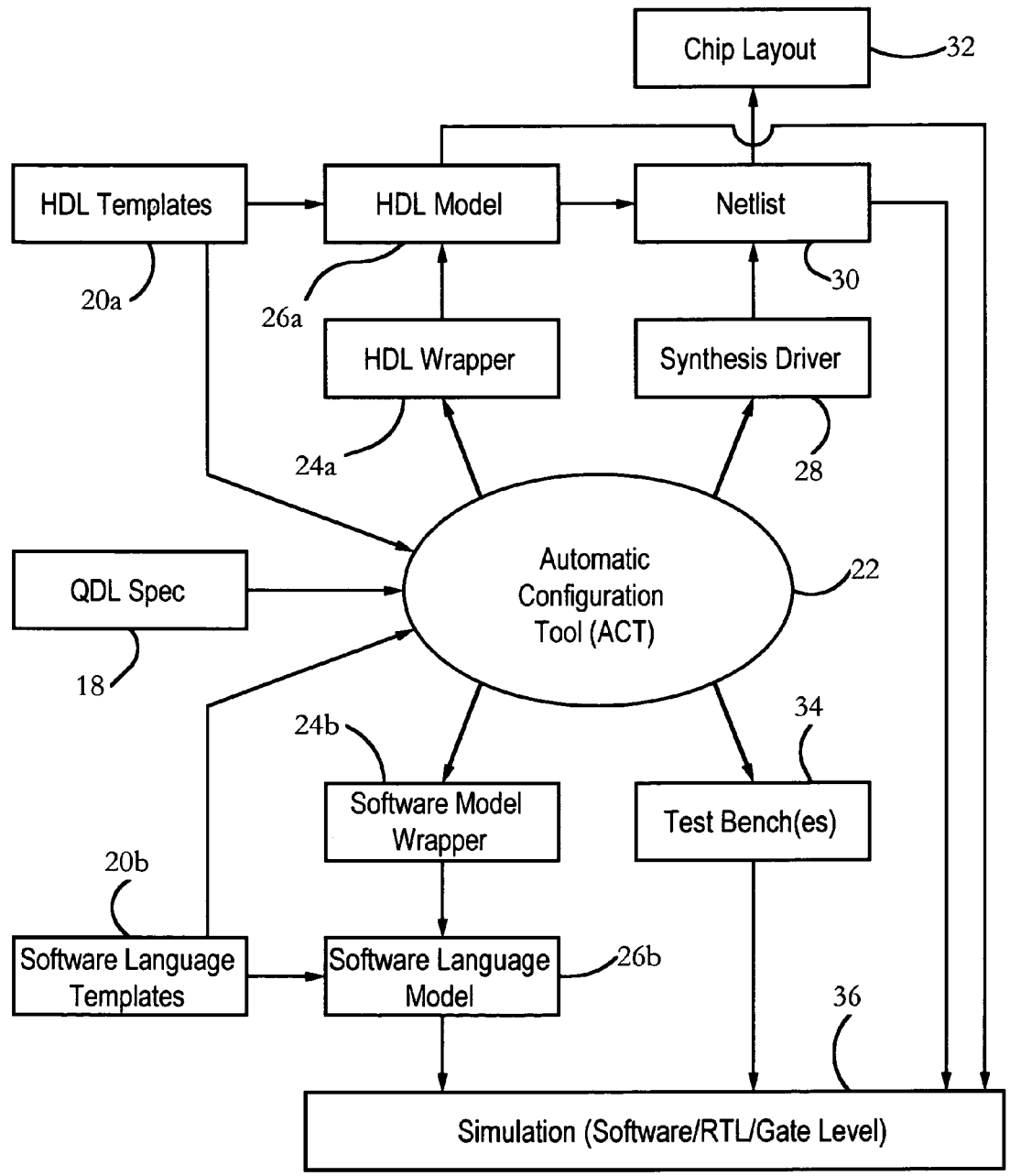
FIG. 3-A

```
token bs       {    sig {   field   = id;}
                    sig {   field   = data;
                            range   = [15:0;]}}
token mvp      {    sig {   field   = mpeg}
                    sig {   field   = layer;
                            range   = [3:0];}
                    sig {   field   = ext;
                            range   = [3:0];}
                    sig {   field   = code;
                            range   = [3:0];}
                    sig {   field   = data;
                            range   = [15:0];}}
```

FIG. 4 — 40

```
object qa_mvp16    {        param BSN = 'MVP_BSN;
                            param BSW = LOG2(BSN);
         input     {        port    = clk;}
         input     {        port    = rst_;}
         token_in  {        type    = bs;
                            port    = vp;}
         token_out {        type    = mvp;
                            port    = vp;}}
```

FIG. 5 — 50

```
module  QDL_MOD_NAME
  (/* QDL_PORT_LIST */);
    /* QDL_PARAM_LIST */
    /* QDL_BUS_DEFS */
    /* QDL_PORT_DECL */
    /* QDL_PORT_WIRE */
// Internal Logic Here;
endmodule //QDL_MOD_NAME
```

FIG. 6-A — 60a

```
(/* Start: QDL_PORT_LIST */
clk             ,
rst_            ,
vp_bs_id        ,
vp_bs_data      ,
vp_bs_rdy       ,
vp_bs_req       ,
vp_mvp_mpeg     ,
vp_mvp_layer    ,
vp_mvp_ext      ,
vp_mvp_code     ,
vp_mvp_data     ,
vp_mvp_rdy      ,
vp_mvp_req
/* End: QDL_PORT_LIST */);
```

FIG. 6-B — 60b

```
/* Start: QDL_PARAM_LIST */
parameter    BSN    = 'MVP_BSN;
parameter    BSW    =
((BSN)<=2)?1:(((BSN)<=4)?2:(((BSN)<=8)?3:(BSN)<=16)?4:5))));
parameter    MVP_NR = 1
/* End: QDL_PARAM_LIST */
```

FIG. 6-C

```
/* Start: QDL_BUS_DEFS */
parameter    BS_ID_MSB      = (0);
parameter    BS_ID_LSB      = (0);
parameter    BS_ID_W        = (BS_ID_MSB - BS_ID_LSB + 1);
parameter    BS_DATA_MSB    = (16-1);
parameter    BS_DATA_LSB    = (0);
parameter    BS_DATA_W      = (BS_DATA_MSB - BS_DATA_LSB + 1);
parameter    BS_ALL         = BS_ID_W + BS_DATA_W;
parameter    MVP_MPEG_MSB   = (0);
parameter    MVP_MPEG_LSB   = (0);
parameter    MVP_MPEG_W = (MVP_MPEG_MSB - MVP_MPEG_LSB + 1);
//some parameters cut out
parameter    MVP_DATA_MSB   = (15);
parameter    MVP_DATA_LSB   = (0);
parameter    MVP_DATA_W = (MVP_DATA_MSB -MVP_DATA_LSB + 1);
parameter    MVP_ALL = MVP_MPEG_W + MVP_LAYER_W +
                      MVP_EXT_W + MVP_CODE_W + MVP_DATA_W;
/* End: QDL_BUS_DEFS */
```

FIG. 6-D

```
q1_qi #(BS_ALL, 1) qa_mvp16_qi (
    .clk     (clk     ),
    .rst_    (rst_    ),
    .idata   ({vp_bs_id, vp_bs_data}),
    .irdy    (vp_bs_rdy),
    .ireq    (vp_bs_req),
    .odata   ({icmd, idata)},
    .ordy    (irdy),
    .oreq    (ireq),);
```

```
/* Start: QDL_PORT_DECL */
input                                        clk;
input                                        rst_;
input                                        vp_bs_id;
input [BS_DATA_MSB:BS_DATA_LSB]              vp_bs_data;
input [1-1:0]                                vp_bs_rdy;
output [1-1:0]                               vp_bs_req;
output                                       vp_mvp_mpeg;
output [MVP_LAYER_MSB:MVP_LAYER_LSB]         vp_mvp_layer;
output [MVP_EXT_MSB:MVP_EXT_LSB]             vp_mvp_ext;
output [MVP_CODE_MSB:MVP_CODE_LSB]           vp_mvp_code;
output [MVP_DATA_MSB:MVP_DATA_LSB]           vp_mvp_data;
output [MVP_NR-1:0]                          vp_mvp_rdy;
input [MVP_NR-1:0]]                          vp_mvp_req;
/* End: QDL_PORT_DECL */
```
60e

```
/* Start : QDL_PORT_WIRE */
wire [1-1:0]                                 vp_bs_req;
wire                                         vp_mvp_mpeg;
wire [MVP_LAYER_MSB:MVP_LAYER_LSB]           vp_mvp_layer;
wire [MVP_EXT_MSB:MVP_EXT_LSB]               vp_mvp_ext;
wire [MVP_CODE_MSB:MVP_CODE_LSB]             vp_mvp_code;
wire [MVP_DATA_MSB:MVP_DATA_LSB              vp_mvp_data;
wire [MVP_NR-1:0]                            vp_mvp_rdy;
/* End : QDL_PORT_WIRE */
```
60f

FIG. 6-F

```
q1_qo #(MVP_ALL, 1, MVP_NR) qa_mvp16_qo (
 .clk     (clk     ),
 .rst_    (rst_    ),
 .idata   ({MpegR, LayerY, ExtR, CodeY, DataY}),
 .irdy    (ordy),
 .ireq    (oreq),
 .odata   ({vp_mvp_mpeg, vp_mvp_ext,
           vp_mvp_code, vp_mvp_data)},
 .ordy    (irdy),
 .oreq    (ireq),);
```
60h

FIG. 6-H

```
namespace QuArc {
class    QDL_NAME\_FDS:
public BlockFDS {public://rest of file descriptor class
public: /* QDL_FDS_PIPE_DECL*/};
class    QDL_NAME:
         public Qblock {
         public:          ~QDL_NAME (void);
         explicit         QDL_NAME (
                          const QDL_NAME\_FDS& arg_fds);
         virtual bool     sim_core(void);
private:         QDL_NAME\_FDS p_f_des;
private: bool    sim_logic (void);
private: /* QDL_TOKEN_DECL */
private: QDL_NAME (const QDL_NAME&);
QDL_NAME&   operator (const QDL_NAME&);};} //End Namespace
```

```
namespace QuArc {
class   QaMVP16_FDS:
        public BlockFDS {
public://rest of file descriptor class
public: /* QDL_FDS_PIPE_DECL */
                 QPipe  vp_bs_fds;
                 QPipe  vp_mvp_fds;};
class   QaMVP16:
        public Qblock {
public:           ~QaMVP16 (void);
        explicit  QaMVP16 (
                  const QaMVP16\_FDS& arg_fds);
        virtual bool     sim_core(void);
private:                 QaMVP16_FDS p_f_des;
private:         bool    sim_logic (void);
private: /* QDL_TOKEN_DECL */
                 VP_BSToken        p_vp_bs;
                 VP_MVPTok n       p_vp_mvp;
private:         QaMVP16 (const QaMVP16&);
QaMVP16&  operator (const QaMVP16&);};} //End Namespace
```

```
namespace QuArc {                                    FIG. 7-C
bool    QDL_NAME::sim_logic(void)
{       //bit-accurate model of algorithm here
        return true;}
QDL_NAME::QDL_NAME (const QDL_NAME\_FDS&   arg_fds)
:
        Qblock          ( );
        p_f_des         (arg_fds),
        /* QDL_CONST_INIT */
{ //initialization code here }
bool QDL_NAME::sim_core(void)
{       /* QDL_INPUT_CONNECTIONS */
        /*QDL_OUTPUT_CONNECTIONS*/
        return sim_logic();}} //End Namespace
```

70c

```
namespace QuArc {                                    FIG. 7-D
bool QAMVP16::sim_logic(void)
{       //bit-accurate model of algorithm here
        return true;}
QAMVP16::QAMVP16 (const QAMVP16_FDS& arg_fds)
:
        Qblock          ( );
        p_f_des         (arg_fds),
        /* Start: QDL_CONST_INIT */
        p_vp_bs         ( ),
        p_vp_mvp        ( )
        /* End: QDL_CONST_INIT */
{ //initialization code here }
bool QAMVP16::sim_core(void)
{       /* Start: QDL_INPUT_CONNECTIONS*/
        p_vp_bs.qpipe (& p_f_des.vp_bs_fds);
        p_vp_bs.instance_name (p_f_des.vp_bs_fds.instance_name());
        /* End: QDL_INPUT_CONNECTIONS*/

/* Start: QDL_OUTPUT_CONNECTIONS*/
        p_vp_mvp.qpipe (& p_f_des.vp_mvp_fds);
        p_vp_mvp.instance_name(p_f_des.vp_mvp_fds.instance_name());
        /* End: QDL_OUTPUT_CONNECTIONS*/
        return sim_logic(); }
```

70d

```
# include ".qdl specs of component Objects"
object qm_miq1        {       param BSN      = 'MIQ1_BSN;
                              param BSW      = LOG2(BSN);
                              REQUIRED PORTS;
                              token_in {
                                      type   = mvp;
                                      port   = vp;}
                              token_out {
                                      type   = dat;
                                      var DW         = 16;}}
```

FIG. 8-A

```
instantiate   {object                = qa_miqa;
              name                   = iqa;
              param BSN              = BSN;
              param BSW              = BSW;
              REQUIRED_CONN;
              connect {      type    = mvp;
                             label   = vp;}
              connect {      type    = iqz;}
              RAM_1port_connect(q, q, 7, 16);}
instantiate   {object                = qa_miqc;
              name                   = iqc;
              REQUIRED_CONN;
              connect {      type    = iqz;}
              connect {      type    = dat;
                             var DW  = 16;}
              RAM_1r1w_connect(z, z, 6, 12);}}
```

FIG. 8-B

```
module QDL_MOD_NAME
   (/* QDL_PORT_LIST */);
     /* QDL_PARAM_LIST */
     /* QDL_BUS_DEFS */
     /* QDL_PORT_DECL */
     /* QDL_PORT_WIRE */
     /* QDL_INSTANCE */
endmodule // QDL_MOD_NAME
```

FIG. 9-A

```
qa_miqa # (    BSN,
               BSW,
               1 )
iqa ( .clk              ( clk ),
      .rst_             ( rst_ ),
      .mvp_mpeg         ( vp_mvp_mpeg ),
      .mvp_layer        ( vp_mvp_layer ),
      .mvp_ext          ( vp_mvp_ext ),
      .mvp_code         ( vp_mvp_code ),
      .mvp_data         ( vp_mvp_data ),
      .mvp_rdy          ( vp_mvp_rdy [0:0] ),
      .mvp_req          ( vp_mvp_req [0:0] ),
      .iqz_as           ( iqz_as ),
      .iqz_data         ( iqz_data ),
      .iqz_rdy          ( iqz_rdy ),
      .iqz_req          ( iqz_req ),
      .qaddr            ( qaddr ),
      .qrde             ( qrde ),
      .qrdata           ( qrdata ),
      .qwre             ( qwre ),
      .qwdata           ( qwdata ) );
qa_miqc # (    DAT_NR )
iqc    (.clk            ( clk ),
        .rst_           ( rst_ ),
        .iqz_as         ( iqz_as ),
        .iqz_data       ( iqz_data ),
        .iqz_rdy        ( iqz_rdy [0:0] ),
        .iqz_req        ( iqz_req [0:0] ),
        .dat_data       ( dat_data ),
        .dat_rdy        ( dat_rdy ),
        .dat_req        ( dat_req ),
        .zrde           ( zrde ),
        .zraddr         ( zraddr ),
        .zrdata         ( zrdata ),
        .zwre           ( zwre ),
        .zwaddr         ( zwaddr ),
        .zwdata         ( zwdata ) );
//RAM Instantiations Here;
```

```
namespace QuArc {                                    FIG. 10-A
class   QmMIQ1_FDS:
        public BlockFDS {
public: //rest of file descriptor class
public:                 /* QDL_FDS_PIPE_DECL */
                        QPipe  vp_mvp_fds;
                        QPipe  dat_fds; };
class   QmMIQ1
:
        public Qblock {
public:                 ~QmMIQ1 (void);
        explicit        QmMIQ1 (
                        const QmMIQ1_FDS& arg_fds);
        virtual bool    sim_core(void);
private:                QmMIQ1_FDS p_f_des;
private: bool           sim_logic (void);
private:                /* QDL_TOKEN_DECL */
                        VP_MVPToken p_vp_mvp;
                        DATToken          p_dat;
private:                QmMIQ1 (const QmMIQ1&);
QmMIQ1&     operator = (const QmMIQ1&);};}
//End Namespace
```
— 100a

```
namespace QuArc {                                    FIG. 10-B
bool    QDL_NAME::sim_logic(void)
{       Proc process;
        /*  QDL INSTANCE */ }
QDL_NAME::QDL_NAME (const QDL_NAME\_FDS&arg_fds)
:
        Qblock          ( );
        p_f_des         (arg_fds),
        /* QDL_CONST_INIT */
{ //initialization code here }
bool QDL_NAME::sim_core(void)
{       /* QDL_INPUT_CONNECTIONS */
        /*QDL_OUTPUT_CONNECTIONS */
        return sim_logic();}} //End Namespace
```
— 100b

```
namespace QuArc {                          FIG. 10-C
bool    QmMIQ1::sim_logic(void)
{       Proc process;
        /* QDL Instance */
        if (!process.fork() ) {
                return false ;}
        if (process.is_child() ) {
102         QaMIQC iqc (p_f_des.qa_miqc_f_des );
                bool rv = iqc.simulate();
                delete_data_pipes();
                return rv;}
        if (process.is_parent() ) {
104         QaMIQA iqa (p_f_des.qa_miqa_f_des );
                bool rv = iqa.simulate ();
                delete_data_pipes ();
                process.wait_all ();
                return rv;}
```

100c

```
QmMIQ1::QmMIQ1 (const QMMIQ1_FDS&  arg_fds)
:
  Qblock                ( );
  p_f_des               (arg_fds),
  /* Start: QDL_CONST_INIT */
  p_vp_mvp              ( ),
  p_dat( )
  /* End: QDL_CONST_INIT */
{ //initialization code here }
bool QmMIQ1::sim_core(void)
{ /* Start: QDL_INPUT_CONNECTIONS */
  p_vp_mvp.qpipe (& p_f_des.vp_mvp.fds);
  p_vp_mvp.instance_name (p_f_des.vp_mvp_fds.instance_name());
  /* End: QDL_INPUT_CONNECTIONS */
  /* Start: QDL_OUTPUT_CONNECTIONS */
  p_dat.qpipe (& p_f_des.dat_des);
  p_dat.instance_name(p_f_des.dat_des.instance_name() );
  /* End: QDL_OUTPUT_CONNECTIONS */
  return sim_logic(); } } // End Namespace    FIG. 10-D
```

100d

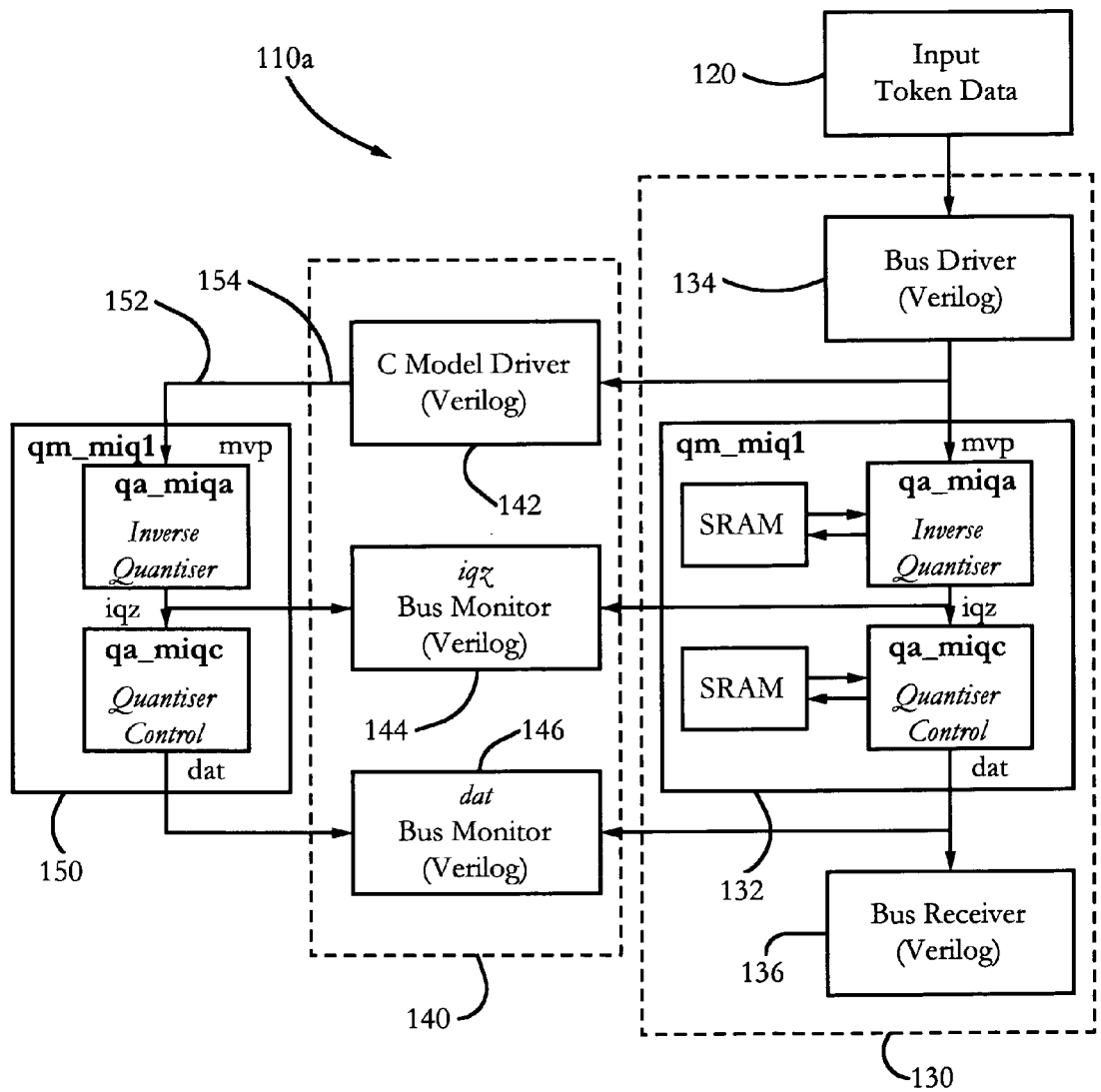
FIG. 11-A

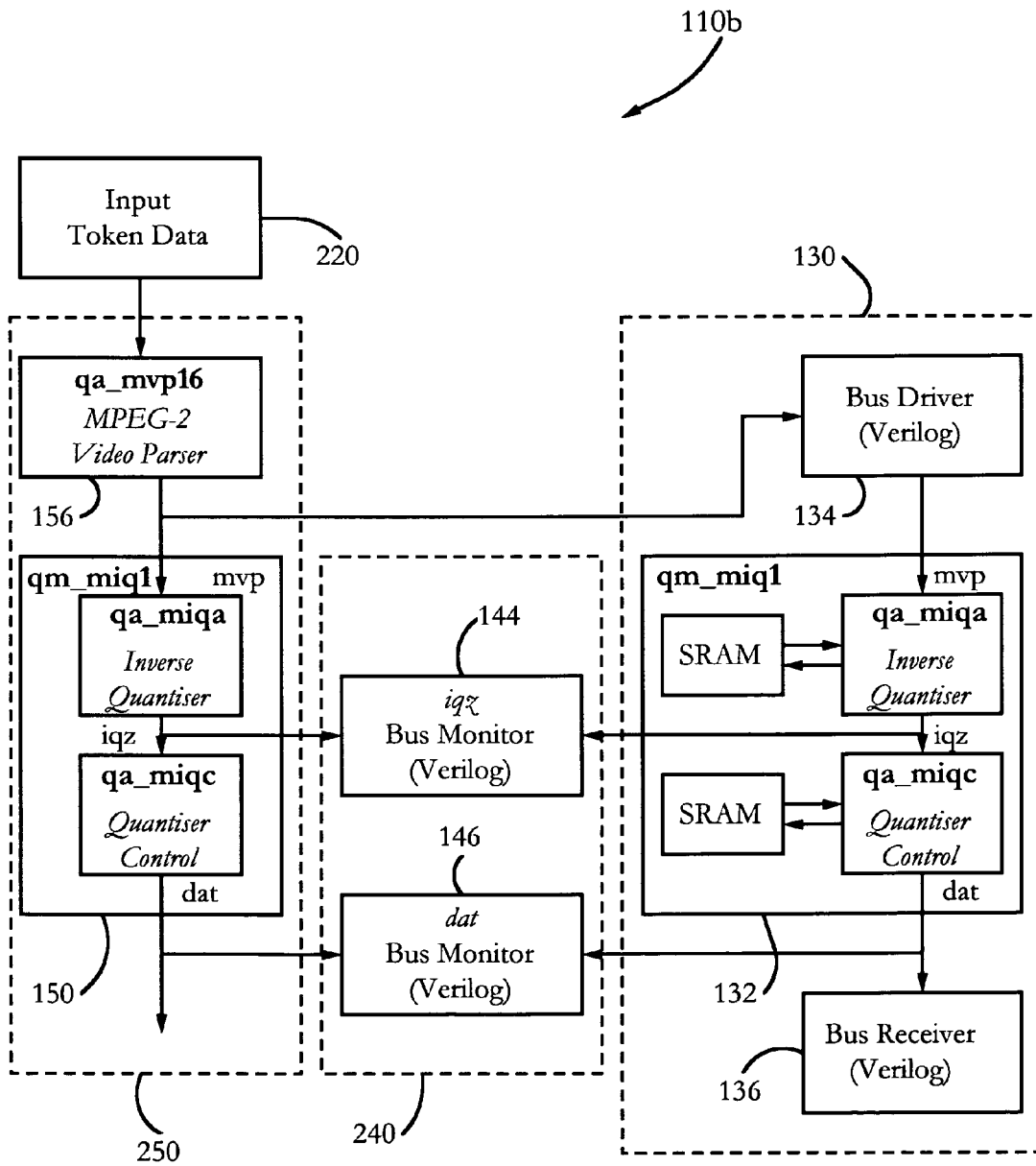
FIG. 11-B

| setglobal | if_input_delay | [expr 0.75 * $cycle_time - $clock_skew] |
| setglobal | if_output_delay | [expr 0.75 * $cycle_time - $clock_skew] |
| setglobal | token_input_delay | [expr 0.85 * $cycle_time - $clock_skew] |
| setglobal | token_output_delay | [expr 0.85 * $cycle_time - $clock_skew] |
| setglobal | ram_input_delay | [expr 0.75 * $cycle_time - $clock_skew] |
| setglobal | ram_output_delay | [expr 0.25 * $cycle_time - $clock_skew] |
| setglobal | token_crit_range | [expr 0.10 * $cycle_time] |
| setglobal | ram_crit_range | [expr 0.10 * $cycle_time] |
| setglobal | def_crit_range | [expr 0.10 * $cycle_time] |
| setglobal | clk_crit_range | [expr 0.10 * $cycle_time] |
| setglobal | def_load | [expr 4 * [load_of "lib. inverter cell"]] |
| setglobal | qif_load | [expr 5 * $def_load] |
| setglobal | def_drive | [drive_of "library NAND2 cell"] |

```
proc    QsynSetTokenInConstraint { bus } {
        upvar token_input_delay token_output_delay ...(rest of variables)
        set token_ports   [get_ports "$(bus)*"]
        set in_ports      [filter $token_ports "@port_direction == in"]
        set out_ports     [filter $token_ports "@port_direction == out"]
        set_input_delay $token_input_delay -clock $clock $in_ports
        set_output_delay $token_output_delay -clock $clock $out_ports
        set_input_delay $if_input_delay -clock $clock $(bus)rdy
        set_output_delay $if_output_delay -clock $clock $(bus)req
        set_load $qif_load $out_ports
        set_drive $def_drive $in_ports
        group_path -critical_range $token_crit_range -name $bus -to $out_ports
        unset token_ports
        unset in_ports
        unset out_ports
        return 1}
```

AUTOMATIC CODE GENERATION FOR INTEGRATED CIRCUIT DESIGN

RELATED APPLICATION DATA

This application is related to U.S. patent application Ser. No. 09/174,439, filed Oct. 16, 1998, now U.S. Pat. No. 6,145,073, entitled "Data Flow Integrated Circuit Architecture," which is assigned to the assignee of the present invention, and is herein incorporated by reference.

COPYRIGHT AND TRADEMARK NOTICE

This disclosure contains material which is subject to copyright protection. The copyright owner, Quintessence Architectures, Inc., has no objection to the facsimile reproduction by anyone of the patent disclosure as it appears in the Patent and Trademark Office patent file or records of any country, but otherwise reserves all rights whatsoever.

QuArc, QDL, and Data Driven Processing are trademarks or registered trademarks of Quintessence Architectures, Inc. Verilog is a registered trademark of Cadence Design Systems, Inc. Synopsys is a registered trademark of Synopsys, Inc. Other products and services are trademarks of their respective owners.

BACKGROUND

This invention relates to integrated circuits (ICs) and data processing systems, in particular to a method of designing integrated circuits.

Continuing advances in semiconductor technology have made possible the integration of increasingly complex functionality on a single chip. Single large chips are now capable of performing the functions of entire multi-chip systems of a few years ago. While providing new opportunities, multi-million-gate systems-on-chip pose new challenges to the system designer. In particular, conventional design and verification methodologies are often unacceptably time-consuming for large systems-on-chip.

Hardware design reuse has been proposed as an approach to addressing the challenges of designing large systems. In this approach, functional blocks (also referred to as cores or intellectual property, IP) are pre-designed and tested for reuse in multiple systems. The system designer then integrates multiple such functional blocks to generate a desired system. The cores are often connected to a common communication bus, and are controlled by a central microcontroller or CPU.

The hardware design reuse approach reduces the redundant re-designing of commonly-used cores for multiple applications. At the same time, the task of interconnecting the cores is often relatively time-consuming and error-prone. In common industry practice, large amounts of hardware description language (HDL) code are written manually for interconnecting the various cores of the system. If one designer changes the interface signals of a block but does not communicate the change to another designer responsible for the interconnection code, valuable time is wasted debugging the design.

In order to verify that a given HDL design performs correctly, it is common to build a behavioral (functional) model of the algorithm in a software language such as C or C++. The results of the software model are then compared against those of the HDL model. The software and HDL model must be kept consistent with each other. Changes to one model must be reflected in the other. Making such changes is typically time-consuming, and increases the chance of introducing inconsistencies between the two models. The complexity of making such changes increases if large teams of engineers are involved in the design process.

Core integration and design maintenance are particularly difficult for cores having complex and/or core-specific interfaces. Core integration and design maintenance are two of the major challenges of designing large systems integrated on a single chip using the hardware design reuse approach.

SUMMARY

The present invention provides a computer-implemented method of designing an integrated circuit. The method comprises establishing a central specification for the circuit, wherein the central specification designates a plurality of data driven cores and a plurality of interconnections between the cores. A software language model and a hardware description language (HDL) model are established for each core. The software language model implements the internal algorithm of the core, while the HDL model implements the corresponding internal logic of the core. The central specification and the software language and HDL models for the individual cores can be manually designed by the system designer and stored in a storage medium and/or system memory.

Software language and HDL core interconnection code is automatically generated according to the central specification, to generate a software language model and an HDL model of the circuit. The software language core interconnection code interconnects the software language models of the individual cores according to the interconnections designated in the central specification. The HDL core interconnection code interconnects the HDL models of the individual cores according to the interconnections designated in the central specification.

Preferably, the HDL core interconnection code includes port declarations, port lists, data type (e.g. wire) declarations, and bus definitions. The software language core interconnection code preferably includes declarations of tokens and pipes. The pipes are objects effecting token transfer to/from the pre-designed software language models of the cores.

Test benches for the circuit and its component cores are further automatically generated, as are logic synthesis constraints for the circuit and its components.

The design method reduces the amount of code that the system designer has to write manually, as well as the amount of work needed for design maintenance and debugging. Changes in the circuit design can be made simply in the central specification. Other parts of the design are automatically updated to reflect any changes.

DESCRIPTION OF THE FIGURES

FIG. 2 shows one of the cores of the circuit of FIG. 1.

FIG. 3-A is a block diagram illustrating schematically the preferred structures and process flow used for implementing a method of designing an integrated circuit according to the preferred embodiment of the present invention.

FIG. 3-B is a flowchart illustrating the steps of a method of designing an integrated circuit according to the preferred embodiment of the present invention.

FIG. 4 illustrates the preferred QuArc Design Language (QDL) code characterizing the token buses connected to the core of FIG. 2.

FIG. 5 shows the preferred QDL specification for the core of FIG. 2.

FIG. 6-A illustrates exemplary verilog-generation macros from a Verilog template for the core of FIG. 2.

FIGS. 6-B–6-H show exemplary automatically-generated Verilog core interconnection code corresponding to the macros of FIG. 6-A.

FIG. 7-A illustrates exemplary C++ code from a generic core C++ template.

FIG. 7-B shows C++ code automatically generated from the template of FIG. 7-A and the QDL specification of FIG. 5.

FIG. 7-C illustrates exemplary C++ code from a C++ template for the core of FIG. 2.

FIG. 7-D shows C++ code automatically generated from the template of FIG. 7-C and the specification of FIG. 5.

FIGS. 8-A and 8-B illustrate two parts of the preferred QDL specification for another core of FIG. 1.

FIG. 9-A shows exemplary Verilog-generation macros from a Verilog template for the core of FIGS. 8-A–8-B.

FIG. 9-B illustrates Verilog code automatically generated from the template of FIG. 9-A and the QDL specification of FIGS. 8-A–8-B.

FIG. 10-A shows C++ code automatically generated by processing the template of FIG. 7-A and the QDL specification of FIGS. 8-A–8-B.

FIG. 10-B illustrates exemplary C++ code from a C++ template for the core of FIGS. 8-A–8-B.

FIGS. 10-C and 10-D show C++ code automatically generated by processing the template of FIG. 10-B and the QDL specification of FIGS. 8-A–8-B.

FIGS. 11-A and 11-B are block diagrams of two alternative test benches suitable for verifying part of the circuit of FIG. 1.

FIGS. 12-A and 12-B show exemplary Synopsys Design-Compiler Tcl script code suitable for implementing synthesis constraints according to the preferred embodiment of the present invention.

DETAILED DESCRIPTION

Figure 1:
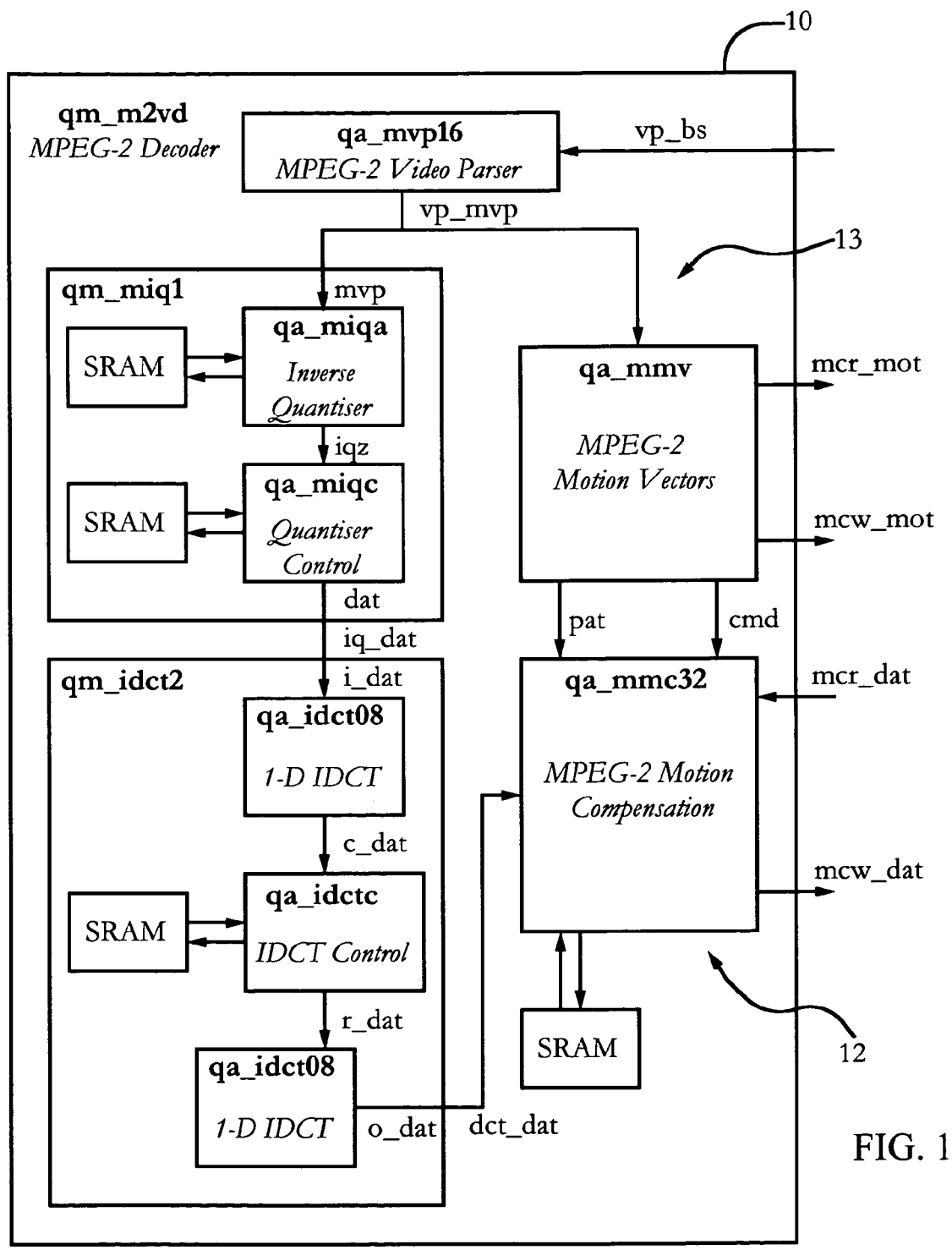
FIG. 1 shows the internal structure of an exemplary integrated circuit formed by a plurality of interconnected data-driven cores, according to the preferred embodiment of the present invention.

In the following description, the statement that two signals are asserted with a predetermined synchronous relationship is understood to mean that the first signal is asserted a predetermined number of clock cycles before the second signal, or that the two signals are asserted synchronously, where the predetermined number of clock cycles is fixed for a given interface. The statement that two signals are asserted synchronously is understood to mean that both signals are asserted simultaneously with respect to a clock signal such as the rising or falling edge of a clock waveform. The statement that a token is transferred synchronously with a first signal and a second signal is understood to mean that the token transfer occurs on the same clock cycle as the synchronous assertion of the first and second signals. A set of elements is understood to contain one or more elements. The term integrated circuit is understood to encompass both an entire circuit implemented on a chip, and a part of an integrated circuit forming a chip.

The following description illustrates embodiments of the invention by way of example and not necessarily by way of limitation.

The presently preferred embodiments can be better understood from the ensuing description of the preferred architecture for an integrated circuit, and the preferred method of designing the integrated circuit according to the present invention.

1. Data-Driven (Data Flow) Architecture

The above-incorporated U.S. Pat. No. 6,145,073, "Data Flow Integrated Circuit Architecture," describes in detail the presently preferred architecture for an integrated circuit. In the architectural approach described in the above-referenced application, an algorithm (e.g. the MPEG decompression process) is decomposed in several component processing steps. A data-driven core (intellectual property, functional block, object) is then designed to implement each desired step. Each core is optimized to perform efficiently a given function, using a minimal number of logic gates. Once designed, a core can be re-used in different integrated circuits.

Each core has a clock connection for receiving global clock signals, and a reset connection for receiving reset signals. The cores are interconnected through dedicated standard interfaces. Each interface includes a ready connection for transferring a ready signal, a request connection for transferring a request signal, and a data (token) connection for transferring a token. Each core processes input tokens (data) received on its input interfaces, and generates output tokens on its output interfaces. A token is transferred from one core to the other only if the sender and receiver core assert ready and request signals, respectively, with a predetermined synchronous relationship, preferably on the same clock edge (synchronously). If an output interface is connected to more than one core, a separate ready/request connection pair is implemented for each core connected to the output interface.

No master controller is needed to regulate the flow of data through the cores. The handshaked connections between the cores create an elastic, variable-schedule pipeline. Each sender or receiver core can stall the data stream in any clock cycle. The control of the cores essentially flows along with the transferred data—thus the terms "data driven" or "data flow" used to characterize the cores and architecture.

A core having the standard interfaces described above can be termed a QuArc Object. QuArc Objects can be classified as Atoms and Molecules. QuArc Atoms are Objects that cannot be divided into other Objects. QuArc Molecules are collections of interconnected Atoms and/or other Molecules. Atoms are degenerate forms of Molecules, leaf-level modules in the design hierarchy.

FIG. 1 shows a diagram of an exemplary integrated circuit 10 according to the preferred embodiment of the present invention. Circuit 10 may be part of a larger system integrated on a single chip. Circuit 10 may also form essentially the entire circuit of a chip. Integrated circuit 10 comprises a plurality of data-driven cores 12 interconnected by standard QuArc interfaces 13. Each core 12 is of at least finite-state-machine complexity, and performs a predetermined function.

Circuit 10 shown in FIG. 1 is an MPEG-2 video decoder core. The particular functionality of circuit 10 is shown as an example only. A methodology of the present invention can be used to design integrated circuits implementing algorithms for a variety of applications, including without limitation digital video and audio processing, data compression and decompression, and wireless and networking packet processing.

Each core 12 of circuit 10 has a name of the form qa_suffix or qm_suffix, where the prefix qa_ denotes an Atom and the prefix m_denotes a Molecule. Integrated circuit 10 itself is a Molecule with the name qm_m2vd. The name of each core 12 is shown in bold within the corresponding box denoting the core, while the function of each core 12 is shown in italics. Molecule qm_m2vd comprises two Molecules (qm_miq1 and qm_idct2), three Atoms (qa_mvp16, qa_mmv, and qa_mmc32), and on-chip static random access memory (SRAM) connected to Atom qa_mmc32. Molecule qm_miq1 comprises Atoms qa_miqa and qa_miqc and on-chip SRAM modules connected to each Atom. Molecule qm_idct2 comprises three Atoms qa_dct08, qa_idctc, and qa_idct08, and SRAM connected to Atom qa_idctc.

Molecule qm_m2vd has two dedicated input interfaces, vp_bs and mcr_dat, for receiving an MPEG-2 Video bitstream and prediction data, respectively. Molecule qm_m2vd further has three dedicated output interfaces, mcr_mot, mcw_mot, and mcw_dat, for sending prediction requests, frame write requests, and frame write data, respectively. Molecule qm_m2vd also has plural internal interfaces (vp_mvp, mvp, iqz, dat, iq_dat, i_dat, c_dat, r_dat, o_dat, dct_dat, pat, and cmd) for transferring tokens between its component Objects.

FIG. 2 illustrates in detail Atom qa_mvp16 and its input and output interfaces vp_bs, vp_mvp. Input interface vp_bs includes a control bus 14a with a pair of standard ready/request control connections for transferring control signals. The control connections include a ready connection bs_rdy for receiving a ready signal indicative of the external availability of a token for transmittal to Atom qa_mvp16, and a request connection bs_req for transmitting a request signal indicative of the capability of Atom qa_mvp16 to receive a token.

Similarly, output token bus vp_mvp includes a control bus 16a with a pair of standard ready/request control connections for transferring control signals. The control connections include a ready connection mvp_rdy for sending a ready signal indicative of the internal availability of a token for transmittal, and a request connection mvp_req for receiving a request signal indicative of an external capability to receive a transmitted token.

Input interface vp_bs further includes a token bus 14b with a set of data connections (wires) for receiving tokens from an external source. The wires of token bus 14b are grouped into logical units called fields: a one-bit field, bs_id, and a sixteen-bit field bs_data. The bit range of field bs_data is shown as [15:0]. The field bs_id transmits bistream data ID information (0 for data, 1 for flags), while the field bs_data transmits corresponding data/flags.

Similarly, output interface vp_mvp comprises a token bus 16b with a set of data connections (wires) for sending tokens to cores qm_miq1 and qa_mmv (shown in FIG. 1). Referring back to FIG. 2, token bus 16b comprises a plurality of fields: mvp_mpeg (parser MPEG standard, 0=MPEG1, 1=MPEG2), mvp_layer (parser layer), mvp_ext (parser extension ID), mvp_code (parser code), and mvp_data (parser data). The bit range for each field is shown in FIG. 2 after each field name.

Atom qa_mvp16 also includes a clk connection for receiving global clock signals, and a rst connection for receiving reset signals. Atom qa_mvp16 further includes internal control logic (not shown) connected to its control and data connections, for controlling the sending and receiving of tokens upon the synchronous assertion of rdy/req signal pairs on its input and output interfaces. The preferred internal structures and operational steps involved in token transfer are described in detail in the above-incorporated U.S. Pat. No. 6,145,073, "Data Flow Integrated Circuit Architecture," and will not be described here further.

As will be apparent to the skilled artisan, each of the cores 12 illustrated in FIG. 1 is structured as exemplified above with reference to Atom qa_mvp16. Each core has a req/rdy control pair on each interface, and each token bus of the core can have one or more fields. If a core output interface is connected to more than one other core, the output interface includes a rdy/req control pair for each core connected to the output interface.

2. Overview of System Design Process

According to the preferred embodiment of the present invention, an integrated circuit is built by interconnecting pre-designed data-driven cores having the above-described standard interfaces. Building the integrated circuit includes multiple steps: establishing a Hardware Description Language (HDL) description of the circuit; establishing a software language model of the circuit, for testing the circuit's functionality; establishing "test benches" for testing the HDL model of the circuit, running the test benches, and comparing the outputs of the HDL model with those of a corresponding software language model; when the HDL description is deemed satisfactory, synthesizing the HDL description into a gate-level description of the circuit, using commercially available logic synthesis tools.

In building a system from pre-designed cores according to industry practice, the system designer would ordinarily be faced with writing large amounts of code for interconnecting the various system constructs such as cores and test bench components. The system designer would need to write HDL code defining various interconnections between pre-designed HDL representations of cores; software language code specifying how tokens are transferred between pre-designed software models of cores; HDL and/or software code specifying interconnections and/or token transfer within test benches; and instructions constraining/directing the synthesis tools.

According to the preferred embodiment of the present invention, the tasks of interconnecting the cores and testing the resulting circuit are simplified by first establishing a central, high-level-language specification of the circuit, and then automatically generating the various required HDL, software language, and synthesis code from the central specification. The presently-preferred high-level language will be hereinafter termed QuArc Design Language, or QDL.

FIG. 3-A illustrates schematically the structures and steps involved in designing an integrated circuit such as circuit 10 according to the preferred embodiment of the present invention. The system designer starts with a manually-designed QDL central specification 18 for the circuit, as well as a set of HDL templates 20a and software language templates 20b for the component cores of the circuit. Each template 20a comprises HDL code defining the internal logic of a component core. Similarly, each template 20b comprises software language code defining the internal functionality (algorithm) of a component core.

An Automatic Configuration Tool (ACT) 22 automatically generates an HDL wrapper 24a and a software language wrapper 24b from QDL specification 18. Wrapper 24a comprises HDL core interconnection code interconnecting the internal logic of different component cores defined in templates 20a. Similarly, wrapper 24b comprises software language core interconnection code for transferring tokens between the internal algorithm code of templates 20b. Preferably, the automatic generation of wrappers 24a–b by the ACT is driven by macro (command) statements incorporated in templates 20a–b. An HDL model 26a of the circuit is formed by adding the code of HDL wrapper 24a to the code of HDL templates 20a. Similarly, a software model of the circuit is formed by adding the code of software language wrapper 24b to the code of software language templates 20b.

ACT 22 further generates a synthesis driver 28 from QDL specification 18. Synthesis driver 28 incorporates a set of synthesis constraints for HDL model 26a. Synthesis driver 28 is used by conventional logic synthesis tools to generate a gate-level netlist 30 from HDL model 26a. Conventional logic synthesis tools are also used to generate a chip layout 32 for the circuit from netlist 30.

ACT 22 generates a set of test benches 34 for the circuit from QDL specification 18. Test benches 34 can include a test bench for the entire circuit, as well as test benches for component Atoms and Molecules of the circuit. Test benches 34 incorporate HDL and software language models for the circuit and/or component cores, as well as driver and monitor modules for driving and monitoring the HDL and software modules. Test benches 34 are used to verify that the HDL and corresponding software language models of the circuit and/or component cores produce identical results. The software and hardware results produced by each test bench 34 are preferably generated in parallel. The results of the software and hardware simulations can be compared in real time, before the entire simulations are complete.

A set of simulation results 36 are generated by running simulations of HDL model 26a, software model 20b, netlist 30, and test benches 34. Simulation results 36 can include results for the entire circuit as well as for individual components of the circuit.

FIG. 3-B is a flow chart schematically illustrating the principal design and verification steps performed according to the preferred embodiment of the present invention. In Step 1, a QDL central specification for the circuit and a set of template files for the component Objects are established. The set of template files includes HDL and software language template files (models) for Molecules and Atoms, as well as test bench and synthesis script templates. The ACT is used to automatically generate hardware description language (HDL) and software language code for the integrated circuit from the central specification and the template files (Steps 2 and 3). The automatically-generated code establishes the necessary control signal and token transfer connections between the different pre-defined Objects.

Test benches for the circuit and its component Objects are also automatically generated (Step 4). Hardware and software simulations for the circuit and each of its components Objects are run, and the simulation results are evaluated (Step 5). Ideally, the results of the software and hardware simulations match for each Object and for the entire circuit. If the HDL design is satisfactory, appropriate synthesis constraints are generated and conventional logic synthesis tools are used to synthesize the design (Step 6). The design can be further tested at the netlist level. The synthesized design can then be physically implemented in silicon.

The steps above need not be performed in the exact order shown. Moreover, the component Objects of the circuit are preferably designed and tested before the circuit is designed and tested as a whole.

The QDL description of circuit 10 preferably includes declarations of: the fields of each token bus (interface) type; the Atoms in the design, their configuration parameters, and their interfaces (input and output token buses); the Molecules in the design, their configuration parameters, their interfaces, the Objects instantiated in each molecule, and the way the Objects are interconnected. The QDL specification of each component core can be incorporated in the central specification using a command such as #include. The QDL description essentially specifies, in a compact, centralized manner, the component Objects of circuit 10 and how the Object interfaces are interconnected.

Each part of the QDL description and its use in automatically generating hardware (HDL) and software language code will now be described in detail with reference to exemplary Objects/circuits.

3. Token Buses: QDL Specification

FIG. 4 shows preferred QDL specification code 40 for the token buses of Atom qa_mvp16 illustrated in FIG. 2. Code 40 includes declarations of the two token buses vp_bs and vp_mvp of Atom qa_mvp16. For each token bus, the component fields and bit-ranges (widths) for the fields are defined. The default bit range is zero, as illustrated by the bs_id field. Optional comments can be included. For each field, characteristics such as sign (e.g. signed or unsigned) or direction (e.g. normal or invert) can be defined if needed. The sign characteristic can be useful for behavioral, software language (e.g. C++) descriptions of Atoms.

The token bus specification can be parameterized. For example, a range declaration can have the form [DW-1:0], where DW is a data width parameter previously declared in the QDL specification of circuit 10. The value of the parameter DW can be defined by a declaration such as "var DW=expression."

Code 40 is maintained in a dedicated token description file, e.g. a file named "token.qdl." The token description file contains declarations of each token bus within circuit 10.

4. Atom: QDL Specification, HDL Code, Software Code

4A. Atom: QDL Specification

FIG. 5 shows preferred QDL specification code 50 for the Atom qa_mvp16 illustrated in FIG. 2. Code 50 includes a set of parameter declarations, illustrated in FIG. 5 by the parameters BSN and BSW. Parameter BSN is a bitstream number, while parameter BSW is the width of the bitstream number BSN. Code 50 also includes a set of standard input port declarations, illustrated in FIG. 5 by the declarations clk and rst_. The underscore at the end of the rst_ signal name signifies that the signal is active low. The standard ports are present in every Object of circuit 10.

The specification further includes a set of input and output token declarations, illustrated by tokens vp_bs and vp_mvp. For each token bus, the declaration includes the bus type and an optional port name. The token bus type (e.g. bs, mvp) is defined in the token specification of FIG. 4. The token port name (e.g. vp) is chosen by the system designer, and may be omitted if only one bus of a given token bus type is present within circuit 10.

By default, each control bus corresponding to a given token bus includes both control connections rdy and req. If only one control connection is desired, the corresponding token declaration in the QDL specification can include, in addition to port and type declarations, a command designating the sole control connection. The command can have the form flow_control=rdy_only or flow_control=req_only. The default configuration (both rdy and req) can also be explicitly declared as flow_control=rdy_req.

4B. Atom: HDL Code

The token and Atom QDL specifications 40, 50 shown in FIGS. 4 and 5 are used in conjunction with a template HDL (e.g. Verilog) file for Atom qa_mvp16 to automatically generate a final HDL file for Atom qa_mvp16. The template file is set up by an engineer. The Automatic Configuration Tool (ACT) is then used to process the QDL specification to add code to the template file and thus automatically generate the final HDL file for Atom qa_mvp16. The added code serves to establish connections between the pre-defined internal logic of the Atom and QDL-defined external bus wires.

FIG. 6-A shows exemplary code 60a from the preferred Verilog template file of Atom qa_mvp16. In addition to code 60a, the template includes Verilog code for the internal logic of Atom qa_mvp16, for example the registers, adders, multipliers for a conventional MPEG-2 video parser (not shown). The internal logic code is pre-designed by the engineer by well-known methods.

Code 60a comprises a plurality of macros (instructions), shown in bold in FIG. 6-A. The Automatic Configuration Tool (ACT) processes the macros to add the desired interface HDL code to the templates. Code 60a includes five macros, which instruct the ACT to generate HDL code for: a port list (QDL_PORT_LIST), a parameter list (QDL_PARAM_LIST), bus definitions (QDL_BUS_DEFS), port declarations (QDL_PORT_DECL), and port wires (QDL_PORT_WIRE). The wire declarations are examples of data type declarations. Other data type declarations can be, for example, register declarations.

Each macro declaration is enclosed between comment signs, and is thus ignored by the HDL compiler but not by the ACT. The macros replace the sections of code in which a designer would otherwise put the interface port list, port declarations, bus definitions, wire declarations, and parameter list.

FIGS. 6-B through 6-F show Verilog exemplary code added to the template Verilog file of Atom qa_mvp16 by processing the five macros of FIG. 6-A, respectively. The information needed for the processing of the macros is taken from QDL code 40, 50 shown in FIGS. 4 and 5.

FIG. 6-B shows an exemplary port list 60b generated by the ACT by processing the port list macro QDL_PORT_LIST of FIG. 6-A. Port list 60b includes a listing of all ports corresponding to the fields shown in FIG. 2. To generate port list 60b, the ACT incorporates the token bus field declarations of FIG. 4 into the token declarations of FIG. 5. Declarations for the required rdy/req connections for each token bus are automatically generated from QDL code 50. Declarations for the required ports clk and rst_ are also automatically generated.

FIG. 6-C shows an exemplary parameter list 60c generated by the ACT by processing the parameter list macro QDL_PARAM_LIST of FIG. 6-A. Parameter list 60c lists 3 parameters: the bitstream number BSN and the bitstream width BSW defined in the atom QDL specification 50 (FIG. 5), and a connection number parameter MVP_NR. The definition of BSW shown in FIG. 6-C is a boolean restatement of the BSW=log2(BSN) definition in the QDL specification 50 of FIG. 5. The connection number MVP_NR is set by default to 1, but can be set at the Molecule level to be equal to the number of objects connected to the bus MVP, as will be apparent from the description below. The parameter MVP_NR is not explicitly declared in the QDL specification 50, and it is automatically generated by the ACT.

FIG. 6-D shows an exemplary set of bus definitions 60d generated by the ACT by processing the bus definition macro QDL_BUS_DEFS of FIG. 6-A. For each token field 14b, 16b shown in FIG. 3, the ACT defines parameters such as field_MSB (most-significant bit), field_LSB (least significant bit), and field_W (width). For each token BS and MVP, a total width parameter token_all is further generated by summing the widths of the component fields of the token.

FIG. 6-E illustrates an exemplary set of port declarations 60e generated by the ACT by processing the port declaration macro QDL_PORT_DECL of FIG. 6-A. The port declarations define the fields of the token buses bs and mvp as inputs or outputs, and specify bit ranges for the fields. The bit ranges incorporate the bus definition parameters shown in FIG. 6-D, as well as the parameter MVP_NR (the number of cores connected to the output token bus) shown in FIG. 6-C.

FIG. 6-F shows an exemplary set of port wires 60f generated by the ACT by processing the port wire macro QDL_PORT_WIRE of FIG. 6-A. As illustrated, wires and associated bit ranges are declared for the signal outputs shown in FIG. 2.

The above-described ports and wires are connected to the pre-designed internal logic of Atom qa_mvp16 through instantiated standard QuArc interfaces (library cells). These library cells implement the rdy/req token transfer protocol and associated timing constraints.

FIGS. 6-G and 6-H illustrate exemplary Verilog code 60g–h for instantiated standard QuArc input and output interfaces ql_qi and ql_qo, respectively. The two interfaces establish connections between the internal logic of Atom qa_mvp16 and the various fields of buses vp_bs and vp_mvp. For example, input interface ql_qi connects its pre-defined data connection .idata to the input token bus vp_bs. Similarly, output interface ql_qo connects its pre-defined data connection .odata to the output token bus vp_mvp.

4C. Atom: Software Code

Preferably, the system designer implements an algorithmic (bit-accurate) model of circuit 10 in an object-oriented software language such as C++ or Java. Preferably, for each Atom of circuit 10, the system designer sets up template software files. If C++ is employed, it is preferred that the designer use two templates: a header (.hh) template and a main source (.cc) template. The header template is completely generic, and is identical for all Objects. The main source template is Object-specific. The template files are then processed by the ACT to generate the final software source code for circuit 10. In particular, the ACT generates code that sets up the communication (interfaces) to other Objects and any other required file input/output (I/O). Communication is preferably set up through C++ objects termed here "pipes." Each pipe corresponds to an Atom interface, and serves to transfer tokens to and from the pre-defined internal code implementing the Atom's algorithm.

FIG. 7-A shows exemplary C++ code 70a for a generic header template for an Object (Atom or Molecule). Boldface text indicates code to be modified using QDL specification information. As shown, code 70a includes two macros, which instruct the ACT to generate C++ code for pipe declarations (QDL_FDS_PIPE_DECL) and for token declarations (QDL_TOKEN_DECL), as will be described in further detail below. The pipes are objects that transfer tokens to and from the core of interest. Code 70a further comprises instructions including the declaration QDL_NAME, which is then replaced by the ACT with the actual name of the Object. In particular, code 70a defines an Object class QDL_NAME, and a file descriptor (or Object connection) class QDL_NAME_FDS. The class QDL_NAME_FDS contains the pipes corresponding to the core QDL_NAME. The function sim_logic simulates the internal logic of the core, which is typically manually generated by the designer. The function sim_core simulates the entire core.

FIG. 7-B shows C++ code 70b generated from the generic header code 70a. Boldface text indicates code that is changed relative to the template code 70a. In code 70b, the actual Object name qa_mvp16 has replaced the generic Object name declaration QDL_NAME. The pipe declaration macro QDL_FDS_PIPE_DECL has been processed to generate declarations of two pipes, Qpipe vp_bs_fds and Qpipe vp_mvp_fds, corresponding to the token buses vp_bs and vp_mvp, respectively. The token declaration macro QDL_TOKEN_DECL has been processed to generate the token declarations VP_BSToken p_vp_bs and VP_MVPToken p_vp_mvp. The portions vp_bs and vp_mvp of the pipe and token names are taken from the QDL specification 50 of Atom qa_mvp16 (FIG. 5).

FIG. 7-C shows exemplary C++ code 70c for the main source (.cc) template for Atom qa_mvp16. As with code 70a, code 70c contains references to the core name QDL_NAME. Code 70c further contains three macros, which instruct the ACT to generate C++ code for: constant initializations (QDL_CONST_INIT), input connections (QDL_INPUT_CONNECTIONS), and output connections (QDL_OUTPUT_CONNECTIONS). The object pf_des specifies all the pipes of interest for the class of Atom qa_mvp16.

FIG. 7-D illustrates C++ code 70d generated from the main source code 70c and the QDL specification 50 of Atom qa_mvp16, shown in FIG. 5. The actual Object name qa_mvp16 has replaced the generic Object name declaration QDL_NAME. The constant initialization macro QDL_CONST_INIT has been processed to generate initializations of the input and output tokens p_vp_bs and p_vp_mvp, respectively. The input connection macro QDL_INPUT_CONNECTION has been processed to specify a data source (the pipe vp_bs_fds) for the input token p_vp_bs. The output connection macro QDL_OUTPUT_CONNECTION has been processed to specify a sink (the pipe vp_mvp_fds) for the output token p_vp_mvp.

The discussion above has shown in detail how HDL and software code is automatically generated from the QDL specification of an exemplary Atom. Automatically-generating HDL and software code for an exemplary Molecule is described in detail below.

5. Molecule: QDL Specification, HDL Code, Software Code

The preferred methodology and syntax for automatically generating HDL and software code for a molecule will be exemplified for the Molecule qm_miq1 shown in FIG. 1.

5A. Molecule: QDL Specification

FIGS. 8-A and 8-B illustrate two parts 80a–b of the preferred QDL specification for the Molecule qm_miq1 shown in FIG. 1. FIG. 8-A shows code 80a including parameter, port, and token declarations similar to those of FIG. 5, while FIG. 8-B illustrates molecule-specific QDL code 80b.

As illustrated by the #include statement in FIG. 8-A, the QDL specification of Molecule qm_miq1 incorporates by reference the QDL specifications of the component Objects of Molecule qm_miq1. Code 80a further includes: declarations of parameters (BSN, BSW), required ports (clk, rst_), and input and output tokens (vp_mvp and dat, respectively). As illustrated for the token of type dat, a port name for a token is not required if that token is the only of a given type within circuit 10. Moreover, the token declarations can include parameter values, as illustrated by the value 16 assigned to the data width parameter DW of token dat.

As shown in FIG. 8-B, code 80b includes instantiation commands for each of the component Atoms qa_miqa and qa_miqc of Molecule qm_miq1. For each Object, code 80b specifies its type (object= in FIG. 8-B), as well as a unique instance name (name= in FIG. 8-B). The instance name is particularly important if two sub-Objects of the same type are instantiated within the same Molecule. Each instantiation command includes declarations of parameters (BSN, BSW), required ports, and Object connections. As illustrated, Atom qa_miqa is connected to token buses vp_mvp and iqz, while Atom qa_miqc is connected to token buses iqz and dat. Each of the Atoms is further connected to on-chip RAM.

Each of the instantiation commands further includes a RAM connection macro. The RAM connection macro specifies labels for its read and write connections, the size of the RAM module, and the width of the RAM bus. For atom qa_miqa, the read and write connection labels are q, the RAM size is $2^7$ bits, and the RAM bus width is 16 bits. For atom qa_miqc, the read and write connection labels are z, the RAM size is $2^6$ bits, and the RAM bus width is 12 bits.

The input and output token buses vp_mvp and dat are both connected to external Objects, as illustrated by the connect commands in FIG. 8-A. Generally, an input bus can be set to receive a constant input, for example an input selecting a certain constant function for an Object. To connect an input bus to a constant source, the connect command can be replaced by a command of the form constant {type=<token_name>; port=<port_label>; value=<expression>}, where expression is a Verilog constant expression identifying the input source for the input bus. Similarly, an output bus can remain unconnected if its corresponding token is not needed elsewhere. To leave an output bus unconnected, the connect command is replaced by a command of the form no_connect {type=<token_name>; port=<port_label>}.

5B. Molecule: HDL Code

The QDL specification 80a–b illustrated in FIGS. 8-A and 8-B is used in conjunction with a generic Molecule template to automatically generate HDL code for Molecule qm_miq1. FIG. 9-A shows the preferred generic Molecule template 90a. Template 90a consists of the Atom template HDL code 60a (FIG. 6-A), with an Object instantiation macro (QDL_INSTANCE) replacing the Atom's manually-designed internal logic. The instantiation macro QDL_INSTANCE directs the ACT to instantiate the component Objects of the Molecule.

The port list, parameter list, bus definition, port declaration, and port wire macros of code 90a are processed to generate Verilog code for Molecule qm_miq1. The generated Verilog code is similar to the Verilog code shown for Atom qa_mvp16 in FIGS. 6-B through 6-F, with the token bus dat replacing the token bus vp_mvp. The parameter DAT_NR defines the bit ranges for the dat_rdy and dat_req output control connections.

FIG. 9-B shows exemplary Verilog code 90b for Molecule qm_miq1 generated by processing the instantiation macro QDL_INSTANCE. Code 90b comprises code for the two component Atoms qa_miqa and qa_miqc of Molecule qm_miq1. Code 90b connects the internal interface wires of each atom (.clk, .rst_, .mvp_rdy, etc.) to the corresponding external wires (clk, rst_, mvp_rdy, etc.). The internal wires include standard wires (.clk, .rst_), token bus wires (.mvp_mpeg, .mvp_layer, etc.), control wires (.mvp_rdy, .mvp_req, etc.) and RAM interface wires (.qaddr, .qrde, etc.). RAM modules are instantiated in a similar manner.

5C. Molecule: Software Code

The header template (.hh) code 70a shown in FIG. 7-A can be used for both Atoms and Molecules. FIG. 10-A shows exemplary C++ code 100a generated by processing the generic header code 70a and the QDL specification 80a–b of Molecule qm_miq1, shown in FIGS. 8-A and 8-B. Automatically-added code is shown in bold.

As shown in FIG. 10-A, the molecule name qm_miq1 replaces the generic call QDL_NAME throughout the header file. The pipe declaration macro QDL_FDS_PIPE_DECL is expanded into declarations of the pipes vp_mvp_fds and dat_fds, each corresponding to one of the buses of Molecule qm_miq1. The token declaration macro QDL_TOKEN_DECL is expanded into token declarations for the input and output tokens p_vp_mvp and p_dat of Molecule qm_miq1.

FIG. 10-B shows exemplary C++ code 100b from the main source (.cc) template for Molecule qm_miq1. Code 100b is identical to code 70c (FIG. 7-C) for the atom main source template, except that the body of the sim_logic function contains an instantiation macro QDL_INSTANCE instead of the atom algorithm. As with code 70c, code 100b includes a constant initialization macro QDL_CONST_INIT, an input connection macro QDL_INPUT_CONNECTIONS, and an output connection macro QDL_OUTPUT_CONNECTIONS.

FIG. 10-C shows C++ code 100c generated by the ACT by processing the instantiation macro QDL_INSTANCE of FIG. 10-B and the molecule QDL specification 80a–b of FIGS. 8-A and 8-B. Code 100c instantiates the component Objects qa_miqc and qa_miqa of Molecule qm_miq1, and connects their interfaces via Unix pipes. Code 100c includes a first section 102 which creates the Atom qa_miqc and starts its simulation, and a second section 104 which creates the Atom qa_miqa and starts its simulation.

FIG. 10-D shows C++ code 100d generated by the ACT by processing the QDL_CONST_INIT, QDL_INPUT_CONNECTIONS, and QDL_OUTPUT_CONNECTIONS macros of code 70c. Code 100d is similar to the atom code 70d shown in FIG. 7-D, with the token buses vp_bs and vp_mvp replaced by the token buses vp_mvp and dat, respectively.

6. Test Benches

Once the designer has generated HDL and software language models for circuit 10 and its component Objects, circuit 10 and its component Objects are tested. Preferably, test benches are generated automatically by the ACT from the QDL specifications of circuit 10 and its component Objects. Test benches are built for entire circuit 10 and for component parts of circuit 10. The test benches are preferably built from the QDL specification of the Object to be tested, from pre-designed templates of standard test bench modules, and from an input source. The system designer simply specifies to the ACT the Object for which a test bench needs to be built and an input source for the Object. The needed test bench code is then generated automatically.

FIGS. 11-A and 11-B show two alternative test benches (test environments) 110a, 110b, respectively, constructed to test the HDL model of Molecule qm_miq1. Test benches 110a, 110b are preferably implemented on a general-purpose computer such as Unix workstation.

As shown in FIG. 11-A, test bench 110a includes a test input token source 120, an HDL simulation module 130 connected to source 120, a software language model 150 of Molecule qm_miq1, and an HDL interconnection module 140 interconnecting HDL module 130 and software language module 150.

Input token source 120 is preferably a file containing a plurality of test input tokens representative of the data received by Molecule qm_miq1. HDL module 130 comprises an HDL (e.g. Verilog) model 132 of Molecule qm_miq1, an HDL bus driver module 134, and an HDL bus receiver module 136. Driver module 134 is connected to token source 120, for receiving test input tokens from token source 120. Driver module 134 is further connected to the Atom qa_miqa of HDL model 132 through the token bus mvp, for transmitting test input tokens to Atom qa_miqa. Receiver module 136 is connected to Atom qa_miqc through the token bus dat, for receiving output tokens generated by HDL model 132. HDL model 132 generates the output tokens by processing the input tokens received from driver module 134. The connections between model 132 and modules 134, 136 each include a standard rdy/req control pair.

Interconnection module 140 comprises a software model driver module 142, an iqz bus monitor module 144, and a dat bus monitor module 146. Driver module 142 is connected to the output of driver module 134, for receiving input tokens from driver module 134. Monitor module 144 is connected to the output of the Atom qa_miqa of HDL model 132, for receiving tokens transferred from Atom qa_miqa over the token bus iqz. Monitor module 146 is connected to the Atom qa_miqc of HDL model 132, for receiving tokens transferred from Atom qa_miqc over the token bus dat. Monitor modules 144, 146 monitor the passage of tokens over buses iqz and dat, respectively, without affecting the token passage.

Software model 150 is a software-language (e.g. C++-written executable) model of Molecule qm_miq1. Model 150 has an input token bus mvp for receiving input tokens, an output token bus dat for transmitting output tokens, and an internal token bus iqz for transferring tokens between its component Atoms qa_miqa and qa_miqc. The buses mvp, iqz, and dat are connected to driver module 142, iqz monitor module 144, and dat monitor module 146, respectively. Each connection between software model 150 and interconnection module 140 is preferably implemented over a Unix pipe 152 and a Verilog Programming Language Interface (PLI) 154.

To verify HDL model 132, the system designer commences the execution of modules 130, 140, and 150. Bus driver module 134 sequentially retrieves input tokens from input token source 120, and transmits the input tokens to HDL model 132 and software model driver 142. For each input token received from bus driver module 134, HDL model 132 generates an output token which it then makes available for transmission over its dat bus. The output token is transmitted to bus receiver module 136 and dat bus monitor module 146. HDL model 132 further generates an intermediate token, which is transmitted over bus iqz to Atom qa_miqc of model 132 and to iqz bus monitor module 144.

Software model driver 142 transmits each input token to the Atom qa_miqa of software model 150. For each input token received, software model 150 generates an output token corresponding to the bus dat, and an intermediate token corresponding to the bus iqz. The output token is transmitted to dat bus monitor module 146, while the intermediate token is transmitted to iqz bus monitor module 144.

Bus receiver module 136 serves to verify that the standard rdy/req QuArc interface for the bus dat of HDL model 132 functions properly. Bus monitor modules 144 and 146 compare the corresponding tokens received from HDL model 132 and software model 150. If the tokens are not identical, it is presumed that there is an error in the system design. Ideally, each output and intermediate token produced by HDL model 132 is identical to a corresponding token generated by software model 150.

For simplicity, the preceding discussion has illustrated the functioning of a test bench for a single input token and a single output token. Generally, there need not be a 1-to-1 correspondence between input and output tokens. An object under test can generate one or more output tokens from one or more input tokens. Generally, a monitor module is connected to each intermediate bus and output bus of the object to be tested, and each input bus of the object is connected to an input token source.

As shown in FIG. 11-B, test bench 110*b* includes a test input token source 220, an HDL simulation module 130, a software language module 250 connected to token source 220, and an HDL interconnection module 240 interconnecting HDL module 130 and software language module 250. Token source 220 is preferably a file containing test input tokens representative of a video bitstream received by Atom qa_mvp16. Module 250 includes software language model 150 of Molecule qm_miq1, a software language model 156 of Atom qa_mvp16, and software language models of the other Objects of the circuit under design. The output of model 156 is connected to HDL bus driver module 134. Interconnection module 240 comprises iqz bus monitor module 144, and dat bus monitor module 146. As in test bench 110*a* (FIG. 11-A), modules 144 and 146 receive input from the iqz and dat buses of model 132, respectively. Modules 144 and 146 further receive corresponding iqz and dat tokens from software model 150. As in test bench 110*a*, all connections between software models and hardware modules are preferably implemented over Unix pipes and Verilog PLI.

During the operation of test bench 110*b*, model 156 sequentially retrieves test input tokens from input token source 220. For each test input token received, model 156 sends a corresponding output token to bus driver module 134 and Atom qa_miqa of model 150. Bus driver module 134 sends each token to Atom qa_miqa of model 132. As described above, bus monitor modules 144, 146 receive the tokens corresponding to the buses iqz and dat from HDL model 132 and software model 150. Each token generated by HDL model 132 is then compared to the corresponding token generated by software model 150.

In both test benches 110*a–b*, software model 150 and HDL model 132 run in parallel, and the simulation results are available and compared in real-time, as they are generated. Consequently, design errors can be identified without waiting for the simulation of an Object or of the entire circuit to end. The early identification of design errors allows shortening the time required for debugging, and simplifies the debugging process.

There is no need to manage a large number of input (stimulus) and output (result) files. Typically, if the software and hardware simulations were to be run independently, a large number of input and output files need to be stored and managed. Furthermore, the automatic generation of the test benches from the QDL specification greatly reduces the time required to set up the test benches.

7. Synthesis Constraints

Once an HDL design has passed all desired verification and testing, the HDL design can be synthesized. The design can be synthesized using commercially-available synthesis tools, such as those marketed by Synopsys, Inc. The synthesis tools generate suitable logic for implementing the circuit from the HDL code for the circuit, a logic library, and a synthesis script which defines synthesis constraints. To facilitate a robust and efficient operation of the circuit, it is preferred that all interface signals adhere to a set of predetermined timing and other synthesis constraints. Adherence to the synthesis constraints ensures the preferred one-token-per-cycle operation of a circuit designed according to the present invention. The preferred synthesis constraints are described below.

The logic driving any output signal may use no more than a predetermined fraction (e.g. <50%, preferably <25%) of the cycle time (clock edge to data output). Furthermore, the logic receiving any input signal may use no more than a predetermined fraction (e.g. <50%, preferably <25%) of the cycle time, including the set-up time of any flip-flop. The above constraints facilitate token transfer on the same clock cycle as the assertion of a rdy/req signal pair.

Preferably, all tokens come directly from a register and go directly into a register. Requiring tokens to come out directly from a register allows reduced clock-to-output delays, while requiring tokens to go directly into a register allows reduced set-up times. To implement the two above token transfer conditions, a more stringent timing constraint can be imposed for the token buses than for the control (rdy/req) buses. For example, the logic driving any token bus output can be required to use no more than a suitable predetermined fraction of the clock cycle. The fraction is chosen to be small enough to preclude the logic synthesis tools from inserting combinational logic at the Object inputs and outputs. Preferably, the fraction is set to 15% of the cycle time.

Since typically data transfer to and from RAM need not occur on the same clock cycle as the corresponding control signal(s), less stringent timing constraints can be used for RAM signals than for other buses. Preferably, all logic driving RAM output signals (read/write enable, address, write data) is allowed to use up to 75% of the cycle time.

It is preferred that all outputs have a standard capacitive load applied thereto. The standard capacitive load can be, for example, at least 5, preferably 20, times the input pin load of a standard-size inverter. The capacitive load ensures that the generated signal strength is sufficient for transmission to multiple receivers. In addition, all inputs preferably have a preset drive strength, preferably substantially equal to the drive of a standard 2-input NAND gate. The drive strength sets a limit on the signal strength required to drive the input.

The above-described constraints are preferably implemented through commands in the synthesis script used by the synthesis tools. The synthesis script is automatically generated by the ACT from a synthesis script template and the QDL specification of the circuit to be synthesized. The template includes generic script code, while the ACT generates design-specific script code.

FIGS. 12-A and 12-B show exemplary generic Synopsys DesignCompiler Tcl script code 320*a–b*, respectively. Code 320*a* and code 320*b* can be part of the same file. Code 320*a* (FIG. 12-A) sets up symbolic names for the values of various synthesis timing parameters. For example, general interface input and output delay parameters (if_input_delay, if_output_delay) are set to 75% of the cycle time minus the clock skew. Setting the input delay parameter to 75% of the clock cycle leaves 25% of the clock cycle for local buffering and register set-up, as required by the preferred constraint described above. Token delay parameters (token_input_delay, token_output delay) are set to 85% of the cycle time minus the clock skew. RAM input (read-data) and output (addr/enables/write-data) delay parameters (ram_input_delay, ram_output_delay) are set to 75% and 25%, respectively, of the clock cycle time minus the clock skew. Code 320a further defines load and drive parameters def_load, qif_load, and def-drive, for implementing the above-described capacitive load and drive strength conditions.

Code 320b (FIG. 12-B) includes script code for a generic procedure for applying timing constraints to an input token bus. Code 320b sets delays for signals entering and leaving each core (set_input_delay, set_output_delay), capacitive loads for output ports (set_load or set_port_fanout_number), and drive strengths for input ports (set_drive or set_driving_cell). Similar code to the one shown in FIG. 12-B can be used to implement constraints for output token buses and RAM interfaces.

To apply the above-described constraints to circuit 10 (FIG. 1), the ACT generates all required script function calls from the QDL specification of circuit 10. For example, to apply the input and output token bus constraints to Atom qa_mvp16, the ACT automatically generates commands like QsynSetTokenInConstraint vp_bs and QsynSetTokenOutConstraint vp_mvp, where the bus names vp_bs and vp_mvp are taken from the QDL specification 50 (FIG. 5) of Atom qa_mvp16.

8. Discussion

The preceding discussion exemplifies the reduction in workload required to design an integrated circuit according to the preferred embodiment of the present invention, as compared to a method involving manually writing all the required HDL, software model, test bench, and synthesis constraint code. To build a circuit from pre-designed cores, the system designer writes manually only the relatively concise QDL specification of the circuit. The ACT then automatically generates extensive HDL model, software model, test bench, and synthesis constraint code.

The central QDL specification allows a reduction in the overhead required for design maintenance. Changes made to the QDL specification propagate to all relevant HDL, software, and test bench objects. Thus, changes in a design do not require extensive code writing or coordination between engineers working on different parts of the design. All relevant Objects are automatically mutually consistent. The QDL specification also serves as a centralized form of documentation for the design.

Automatically-generating synthesis constraints further reduces the time required to build an integrated circuit according to the preferred embodiment of the present invention. The synthesis constraints make the inter-Object signal delays predictable. The inter-Object delays are kept to under one clock cycle, and thus should not slow down the operation of the circuit. Only a small number of wires, such as the wires carrying the clock signal clk, are routed globally. Predicting wire delays is a problem of particular importance for large systems-on-chip implemented using high-density manufacturing processes (0.25 µm and below).

A skilled artisan can readily produce an Automatic Configuration Tool of the present invention by supplying the above-described syntax to a publicly-available compiler such as Yet Another Compiler Compiler (YACC). The compiler can be readily used to generate a suitable Automatic Configuration Tool from the above-described syntax and methodology.

The present invention further provides computer systems programmed to perform a method of the present invention, computer-readable media encoding instructions to perform a method of the present invention, as well as integrated circuits and circuit representations designed according to a method of the present invention. Suitable computer-readable media include, without limitation, magnetic disks, hard drives, CDs, DVDs, Flash ROM, non-volatile ROM, and RAM. Integrated circuit representations include, without limitation, software language, HDL, netlist, and logic layout representations of the circuit.

It will be clear to one skilled in the art that the above embodiments may be altered in many ways without departing from the scope of the invention. While the preceding discussion has focused on an exemplary integrated circuit, the skilled artisan will appreciate that the described systems and methods apply to other integrated circuits, as well as to integrated circuits forming parts of the circuit illustrated above. The methodology described above can be used for designing cores for a variety of applications, including digital signal processing (DSP) modules, discrete cosine or inverse cosine transform (DCT, IDCT) modules, arithmetic logic units (ALU), central processing units (CPUs), bit stream parsers, and memory controllers. The ready and request signals may be multi-bit signals. Automatically-generated code can include declarations of data types other than wires—e.g. registers. While the preceding discussion illustrates the invention with reference to a Verilog/C++/Unix implementation, the invention is not limited to the particular languages or environments used as examples. The Hardware Description Language employed can be Verilog, VHDL, or any other suitable hardware description language. The software language used can be C++, Java, C or any other suitable software language. A method of automatically generating code for interconnecting cores according to the present invention need not be limited to the described preferred architecture and interface protocol. Accordingly, the scope of the invention should be determined by the following claims and their legal equivalents.

What is claimed is:

1. A computer-implemented method of designing an integrated circuit, comprising the steps of:
   a) establishing a central specification for the integrated circuit, the central specification designating a plurality of cores and a plurality of interconnections between the cores;
   b) establishing a set of software lance models for the cores, each software language model implementing an internal algorithm of one of the cores;
   c) establishing a set of hardware description language models for the cores, each hardware description language model implementing an internal logic of one of the cores;
   d) generating software language core interconnection code for interconnecting the software language models according to the central specification, to generate a software language model of the circuit; and
   e) generating hardware description language core interconnection code for interconnecting the hardware description language models according to the central specification, to generate a hardware description language model of the circuit.

2. The method of claim 1 wherein:
   a) the central specification designates a set of input tokens and a set of output tokens for each core; and
   b) the central specification designates a set of token fields for each interconnection.

3. The method of claim 2 wherein generating the hardware description language core interconnection code comprises generating a set of port declarations from the sets of token fields, input tokens, and output tokens defined in the central specification.

4. The method of claim 2 wherein generating the hardware description language core interconnection code comprises generating an interface port list from the sets of token fields, input tokens, and output tokens defined in the central specification.

5. The method of claim 2 wherein generating the hardware description language core interconnection code comprises generating a set of data type declarations from the sets of token fields, input tokens, and output tokens defined in the central specification.

6. The method of claim 2 wherein generating the hardware description language core interconnection code comprises generating a set of bus definitions from the sets of token fields, input tokens, and output tokens defined in the central specification.

7. The method of claim 2 wherein:
   a) at least one of the token fields defined in the specification includes a token field parameter; and
   b) the central specification further comprises an assignment of a value for the token field parameter.

8. The method of claim 1 further comprising generating a hardware description language declaration for a clock input port and a reset input port for each of the cores.

9. The method of claim 1 wherein, for each core:
   a) the central specification defines a set of core parameters; and
   b) generating the hardware description language model comprises generating a set of hardware description language parameter declarations from the set of core parameters.

10. The method of claim 1 wherein:
    a) for each core, the central specification defines a set of input tokens and a set of output tokens; and
    b) generating the software language model comprises generating declarations for a set of pipes and a set of tokens from the sets of input tokens and output tokens defined in the central specification, each pipe serving to transfer tokens between the cores.

11. The method of claim 1 further comprising the step of generating a test bench for the integrated circuit, the test bench including the hardware description language model and the software language model, for comparing a result of a software simulation of the circuit to a result of a hardware simulation of the circuit.

12. The method of claim 11 wherein the test bench comprises a bus driver module for driving the hardware description language model of the integrated circuit.

13. The method of claim 11 wherein the test bench further comprises a software-driver module for driving the software language model of the integrated circuit.

14. The method of claim 11 wherein the test bench further comprises a monitor module for comparing the result of the software simulation to the result of the hardware simulation.

15. The method of claim 11 wherein the test bench further comprises a bus receiver module for requesting tokens from the hardware description language model.

16. The method of claim 1, further comprising the steps of:
    a) driving the hardware description language model with a simulation hardware input;
    b) driving the software language model with a simulation software input;
    c) detecting a response of the hardware description language model to the simulation hardware input;
    d) detecting a response of the software language model to the simulation software input; and
    e) comparing the response of the hardware description language model to the simulation hardware input to the response of the software language model to the simulation software input.

17. The method of claim 16 wherein steps (b) and (e) are performed at least in part concurrently with a simulation of the hardware description language model.

18. The method of claim 1 further comprising the step of generating a synthesis constraint for the circuit.

19. The method of claim 18 wherein the synthesis constraint limits the fraction of a clock cycle used by a core interface.

20. The method of claim 1 wherein generating the hardware description language model comprises the step of instantiating a hardware subcore model forming part of one of the cores.

21. The method of claim 20 wherein generating the software language model comprises the step of instantiating a software subcore model forming part of one of the cores.

22. The method of claim 1 wherein generating the software language model comprises the step of instantiating a software subcore model forming part of one of the cores.

23. The method of claim 1 wherein the plurality of interconnections comprises a dedicated interconnection connecting a first core and a second core, the first interconnection comprising:
    a) a ready connection for carrying a ready signal from the first core to the second core, the ready signal being indicative of a readiness of the first core to transmit a token to the second core;
    b) a request connection for carrying a request signal from the second core to the first core, the request signal being indicative of a readiness of the second core to receive the token from the first core; and
    c) a token bus for transmitting the token from the first core to the second core upon a synchronous assertion of the ready signal and the request signal.

24. The method of claim 1, wherein each of the plurality of cores is a data-driven core.

25. The method of claim 1, wherein the hardware description language core interconnection code designates a set of intercore handshake connections and a set of corresponding intercore data connections.

26. A computer-implemented method of designing an integrated circuit, comprising the steps of:
    a) establishing a central specification for the integrated circuit, the central specification designating a plurality of cores and a plurality of interconnections between the cores;
    b) for each core, establishing hardware description language template code for an internal logic of the core;
    c) for each core, establishing software language template code for an internal algorithmic functionality of the core;
    d) processing the central specification to generate software language core interconnection code for interconnecting the software language template code for the cores, to generate a software language model of the circuit; and e) processing the central specification to generate hardware description language core interconnection code for interconnecting the hardware description language template code for the cores, to generate a hardware description language model of the circuit.

27. The method of claim 26 wherein the hardware description language core interconnection code comprises an interface port list, a set of port declarations, a set of interface bus definitions, and a set of data type declarations.

28. The method of claim 27 wherein the port list comprises a global clock port and a reset port for each core.

29. The method of claim 26 wherein the software language core interconnection code comprises a set of pipe declarations and a set of token declarations.

30. The method of claim 26, further comprising the step of processing the central specification to add a parameter list to the hardware description language template code.

31. The method of claim 26, further comprising the step of processing the central specification to add a parameter list to the software language template code.

32. The method of claim 26, wherein each of the plurality of cores is a data-driven core.

33. The method of claim 26, wherein the hardware description language core interconnection code designates a set of intercore handshake connections and a set of corresponding intercore data connections.

34. A computer-implemented method of designing an integrated circuit, comprising the steps of:
   a) establishing a central specification for the integrated circuit, the central specification designating a plurality of cores and a plurality of dedicated interconnections between the cores;
   b) generating a software language, functional model of the integrated circuit from the central specification and from a set of software language, functional models of the cores;
   c) generating a hardware description language model of the integrated circuit from the central specification and from a set of hardware description language models of the cores, the hardware description language model of the integrated circuit designating a set of intercore handshake connections and a set of corresponding intercore data connections;
   d) generating a test bench for the circuit from the hardware description language model and the software language model, for comparing a result of a software simulation of the circuit to a result of a hardware simulation of the circuit; and
   e) generating a set of logic synthesis constraints for the circuit from the central specification, for constraining a logic synthesis of the circuit.

35. The method of claim 34, wherein each of the plurality of cores is a data-driven core.

36. The method of claim 34, wherein the hardware description language core interconnection code designates a set of intercore handshake connections and a set of corresponding intercore data connections.

37. A computer-implemented method of designing an integrated circuit, comprising the steps of:
   a) establishing a central specification for the integrated circuit, the central specification designating a plurality of cores and a plurality of interconnections between the cores;
   b) generating a software language, functional model of the integrated circuit from the central specification and from a set of software language, functional models of the cores; and
   c) generating a hardware description language model of the integrated circuit from the central specification and from a set of hardware description language models of the cores.

38. The method of claim 37, wherein each of the plurality of cores is a data-driven core.

39. The method of claim 37, wherein the hardware description language core interconnection code designates a set of intercore handshake connections and a set of corresponding intercore data connections.

40. A computer system programmed to perform the steps of:
   a) establishing a central specification for the integrated circuit, the central specification designating a plurality of cores and a plurality of interconnections between the cores;
   b) generating a software language, functional model of the integrated circuit from the central specification and from a set of software language, functional models of the cores; and
   c) generating a hardware description language model of the integrated circuit from the central specification and from a set of hardware description language models of the cores.

41. The system of claim 40, wherein each of the plurality of cores is a data-driven core.

42. The system of claim 40, wherein the hardware description language core interconnection code designates a set of intercore handshake connections and a set of corresponding intercore data connections.

43. A computer-readable medium encoding instructions to perform the steps of:
   a) establishing a central specification for the integrated circuit, the central specification designating a plurality of cores and a plurality of interconnections between the cores;
   b) generating a software language, functional model of the integrated circuit from the central specification and from a set of software language, functional models of the cores; and
   c) generating a hardware description language model of the integrated circuit from the central specification and from a set of hardware description language models of the cores.

44. The computer readable medium of claim 43, wherein each of the plurality of cores is a data-driven core.

45. The computer readable medium of claim 43, wherein the hardware description language core interconnection code designates a set of intercore handshake connections and a set of corresponding intercore data connections.

46. A circuit design apparatus comprising:
   a) a storage device for establishing a central specification for the integrated circuit, the central specification designating a plurality of cores and a plurality of interconnections between the cores;
   b) software interconnection means for generating a software language, functional model of the integrated circuit from the central specification and from a set of software language, functional models of the cores; and c) hardware description language interconnection means for generating a hardware description language model of the integrated circuit from the central specification and from a set of hardware description language models of the cores.

47. The apparatus of claim 46, wherein each of the plurality of cores is a data-driven core.

48. The apparatus of claim 46, wherein the hardware description language core interconnection code designates a set of intercore handshake connections and a set of corresponding intercore data connections.

* * * * *

UNITED STATES PATENT AND TRADEMARK OFFICE
CERTIFICATE OF CORRECTION

PATENT NO. : 6,996,799 B1 Page 1 of 1
DATED : February 7, 2006
INVENTOR(S) : Cismas et al.

It is certified that error appears in the above-identified patent and that said Letters Patent is hereby corrected as shown below:

Column 18,
Line 52, replace "lance" with -- language --.

Signed and Sealed this

Eighteenth Day of April, 2006

JON W. DUDAS
*Director of the United States Patent and Trademark Office*